US011521941B2

United States Patent
Oda et al.

(10) Patent No.: US 11,521,941 B2
(45) Date of Patent: Dec. 6, 2022

(54) SEMICONDUCTOR DEVICE WITH A SUBSTRATE HAVING DEPRESSIONS FORMED THEREON

(71) Applicant: FUJI ELECTRIC CO., LTD., Kawasaki (JP)

(72) Inventors: Yoshinori Oda, Matsumoto (JP); Yoshinori Uezato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 20 days.

(21) Appl. No.: 17/135,285

(22) Filed: Dec. 28, 2020

(65) Prior Publication Data

US 2021/0118822 A1 Apr. 22, 2021

Related U.S. Application Data

(63) Continuation of application No. PCT/JP2019/046531, filed on Nov. 28, 2019.

(30) Foreign Application Priority Data

Jan. 16, 2019 (JP) .............................. JP2019-005278

(51) Int. Cl.
*H01L 23/58* (2006.01)
*H01L 23/13* (2006.01)
(Continued)

(52) U.S. Cl.
CPC ............ *H01L 23/585* (2013.01); *H01L 23/13* (2013.01); *H01L 23/15* (2013.01);
(Continued)

(58) Field of Classification Search
CPC ....... H01L 23/585; H01L 23/13; H01L 23/15; H01L 23/3735; H01L 25/07; H01L 25/18
(Continued)

(56) References Cited

U.S. PATENT DOCUMENTS

| 5,527,620 A | 6/1996 | Schulz-Harder |
| 2003/0173660 A1 | 9/2003 | Kitamura et al. |

(Continued)

FOREIGN PATENT DOCUMENTS

| DE | 112019001086 T5 | 11/2020 |
| EP | 1345480 A2 | 9/2003 |

(Continued)

OTHER PUBLICATIONS

International Search Report for PCT/JP2019/046531, dated Mar. 3, 2020.
Written Opinion for PCT/JP2019/046531, dated Mar. 3, 2020.
1st Office Action for corresponding German Patent Application No. 11 2019 002 922.3 dated Aug. 31, 2022.

*Primary Examiner* — Quoc D Hoang
(74) *Attorney, Agent, or Firm* — Rabin & Berdo, P.C.

(57) ABSTRACT

A semiconductor device including a semiconductor chip disposed on a substrate having a conductive pattern, an insulating plate and a metal plate that are sequentially formed and respectively have the thicknesses of T2, T1 and T3. The metal plate has a plurality of depressions formed on a rear surface thereof. In a side view, a first edge face, which is an edge face of the conductive pattern, is at a first distance away from a second edge face that is an edge face of the metal plate, and a third edge face, which is an edge face of the semiconductor chip, is at a second distance away from the second edge face. Each depression is located within a depression formation distance from the first edge face, where: 0<depression formation distance≤(0.9×T1²/first distance), and/or (1.1×T1²/first distance)≤depression formation distance<second distance.

8 Claims, 7 Drawing Sheets

(51) Int. Cl.
  *H01L 23/15*    (2006.01)
  *H01L 23/373*   (2006.01)
  *H01L 25/07*    (2006.01)
  *H01L 25/18*    (2006.01)
  *H05K 1/03*     (2006.01)
  *H05K 1/05*     (2006.01)

(52) U.S. Cl.
  CPC .......... *H01L 23/3735* (2013.01); *H01L 25/07* (2013.01); *H01L 25/18* (2013.01); *H05K 1/0306* (2013.01); *H05K 1/053* (2013.01); *H05K 2201/09145* (2013.01)

(58) Field of Classification Search
  USPC ........................................................ 257/758
  See application file for complete search history.

(56) References Cited

U.S. PATENT DOCUMENTS

| | | | |
|---|---|---|---|
| 2008/0164588 A1* | 7/2008 | Lee | .................... H01L 23/3107 257/668 |
| 2018/0005956 A1 | 1/2018 | Degraeve | |
| 2020/0194386 A1 | 6/2020 | Uezato | |

FOREIGN PATENT DOCUMENTS

| | | |
|---|---|---|
| EP | 3264869 A1 | 1/2018 |
| JP | 2003-100965 A | 4/2003 |
| JP | 2003-273289 A | 9/2003 |
| JP | 2006-140401 A | 6/2006 |
| JP | 2012-114203 A | 6/2012 |
| JP | 2015-225948 A | 12/2015 |
| WO | 2019/167509 A1 | 9/2019 |

\* cited by examiner

SEMICONDUCTOR DEVICE WITH A SUBSTRATE HAVING DEPRESSIONS FORMED THEREON

CROSS-REFERENCE TO RELATED APPLICATION

This application is a continuation application of International Application PCT/JP2019/046531 filed on Nov. 28, 2019 which designated the U.S., which claims priority to Japanese Patent Application No. 2019-005278, filed on Jan. 16, 2019, the entire contents of which are incorporated herein by reference.

BACKGROUND OF THE INVENTION

1. Field of the Invention

The embodiments discussed herein relate to a semiconductor device.

2. Background of the Related Art

Semiconductor devices include semiconductor chips, for example, insulated gate bipolar transistors (IGBTs), power metal oxide semiconductor field effect transistor (power MOSFETs), and so forth. Such semiconductor devices are used, for example, as power converters. Semiconductor devices include the aforementioned semiconductor chips and a ceramic circuit substrate. The ceramic circuit substrate includes an insulating plate, a plurality of conductive patterns which is formed on the front surface of the insulating plate and on which the semiconductor chips are mounted, and a metal plate formed on the rear surface of the insulating plate. Further, on the rear surface of the ceramic circuit substrate, a heat radiating unit such as a heatsink is installed.

In recent years, ceramic circuit substrates are sometimes reduced in size in an effort to miniaturize semiconductor devices. However, layout areas on the ceramic circuit substrates, where semiconductor chips are mounted, need to be maintained. In addition, in order to provide semiconductor devices with desired functions, the semiconductor chip layout areas on the ceramic circuit substrates are sometimes increased without enlarging the ceramic circuit substrates. Therefore, in either case, the distance between the edge face of each conductive pattern and the edge face of the insulating plate (edge-to-edge distance) needs to be reduced.

In manufacturing a semiconductor device, semiconductor chips are mounted, via solder, onto a ceramic circuit substrate which is mounted onto a radiator plate via solder. Then, they are heated and subsequently cooled. Herewith, the semiconductor chips, the ceramic circuit substrate, and the radiator plate are held together by solder. The semiconductor device undergoes temperature changes associated with its own operation. The semiconductor device is also subjected to temperature changes in the external environment. Therefore, due to the insulating plate having a different coefficient of thermal expansion relative to the conductive patterns and the metal plate, the ceramic circuit substrate is subjected to thermal stress. This causes cracks in the insulating plate, thus decreasing the reliability of the semiconductor device. In view of this problem, dimples (depressions) are formed on the rear surface of the metal plate in the ceramic circuit substrate to relieve the thermal stress applied to the ceramic circuit substrate (see, for example, Description of U.S. Pat. No. 5,527,620).

However, cracks may occur in the insulating plate depending on where on the rear surface of the metal plate in the ceramic circuit substrate the dimples are located. The dimples therefore need to be formed at appropriate positions on the rear surface of the metal plate while reducing the edge-to-edge distance between the edge face of the insulating plate and that of each conductive pattern.

SUMMARY OF THE INVENTION

According to an aspect, there is provided a semiconductor device including: a semiconductor chip; and a substrate, including: an insulating plate with a thickness of $T1$, a conductive pattern with a thickness of $T2$, the semiconductor chip being mounted on a front surface of the conductive pattern, the insulating plate being positioned on a rear surface of the conductive pattern, and a metal plate with a thickness of $T3$, the metal plate being positioned on a rear surface of the insulating plate, and having a plurality of depressions formed on a rear surface thereof, wherein, in a side view of the semiconductor device, a first edge face, which is an edge face of the conductive pattern, is, measured inwardly of the substrate in a horizontal direction along a main surface of the substrate, at a first distance away from a second edge face that is an edge face of the metal plate, a third edge face, which is an edge face of the semiconductor chip, is, measured inwardly of the substrate in the horizontal direction, at a second distance away from the second edge face, and each of the plurality of depressions is located within a depression formation distance, measured inwardly of the substrate in the horizontal direction, from the first edge face, the depression formation distance satisfying at least one of: $0 < \text{the depression formation distance} \leq (0.9 \times T1^2/\text{the first distance})$, and $(1.1 \times T1^2/\text{the first distance}) \leq \text{the depression formation distance} < \text{the second distance}$.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings.

1. First Embodiment

Figure 1:
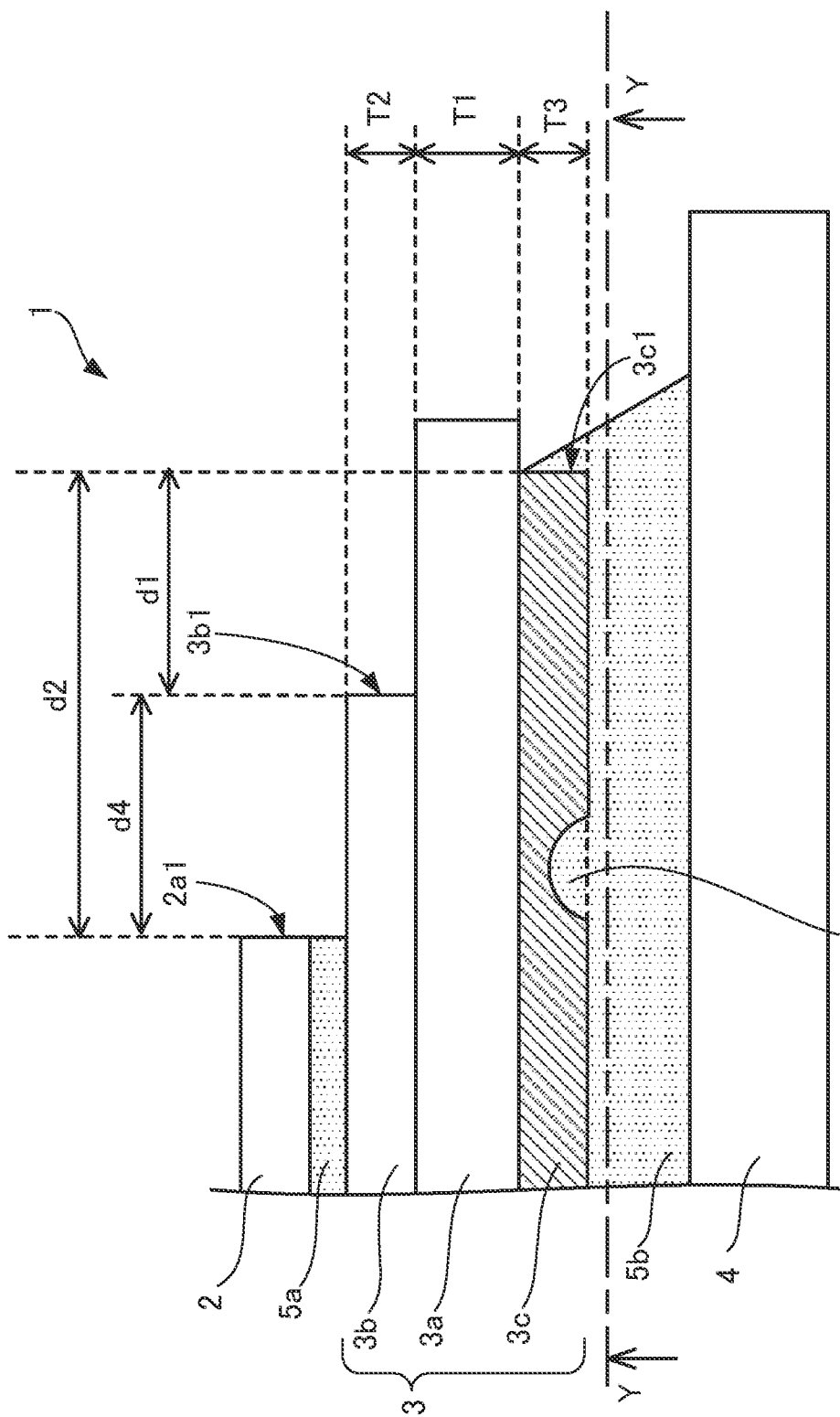
FIG. 1 is a cross-sectional view of a semiconductor device according to a first embodiment.
Figure 2:
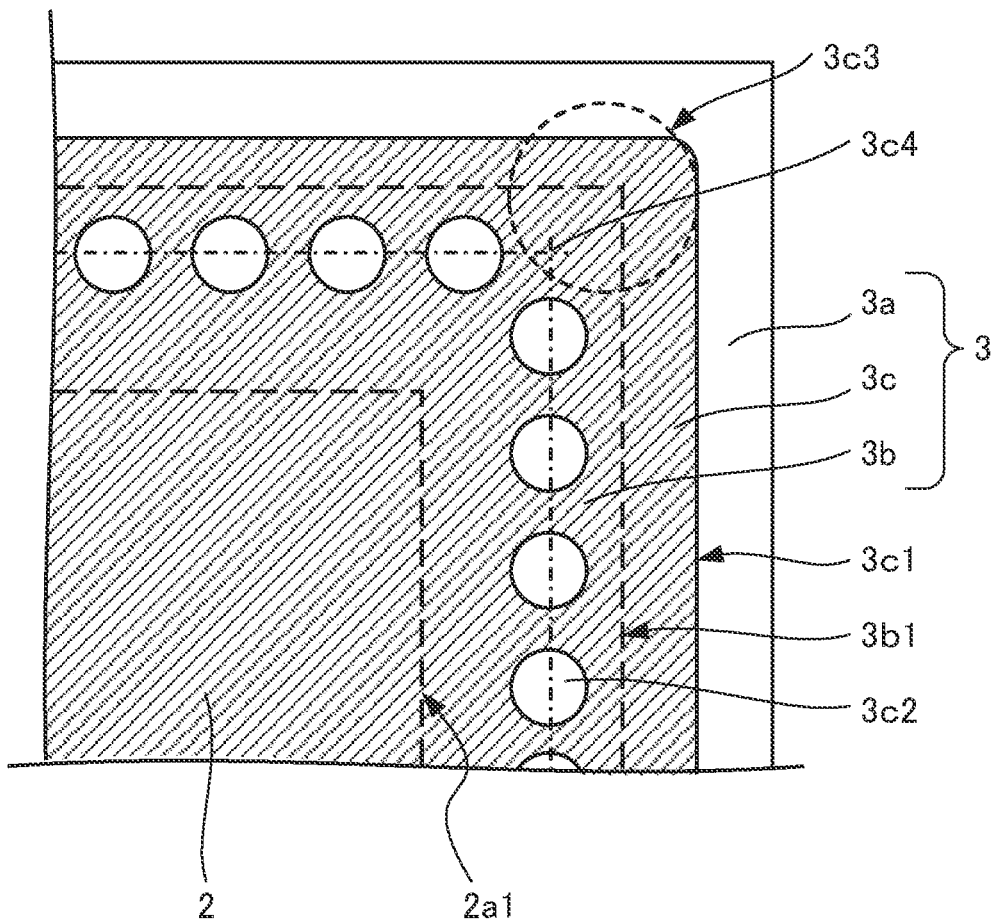
FIG. 2 is a plan view of a ceramic circuit substrate included in the semiconductor device according to the first embodiment.

A semiconductor device according a first embodiment is described with reference to FIGS. 1 and 2. FIG. 1 is a cross-sectional view of the semiconductor device according to the first embodiment. FIG. 2 is a plan view of a ceramic circuit substrate included in the semiconductor device according to the first embodiment. Note that FIG. 2 is a cross-sectional view of a semiconductor device 1 (depicting the rear surface of a ceramic circuit substrate 3) along dashed-dotted line Y-Y of FIG. 1. Therefore, as for a conductive pattern 3b, an installation position thereof is represented by a broken line. In the first embodiment, the term "front surface" refers to a surface facing upward in the semiconductor device 1 of FIG. 1. For example, in the case of the ceramic circuit substrate 3, a surface on which a semiconductor chip 2 is mounted is its front surface. The term "rear surface" refers to a surface facing downward in the semiconductor device 1 of FIG. 1. In the case of the ceramic circuit substrate 3, for example, a surface to which a radiator plate 4 is bonded is its rear surface. The terms "front surface" and "rear surface" also have the same orientational relationships in drawings other than FIG. 1. For example, FIG. 2 depicts the rear surface of the ceramic circuit substrate 3.

The semiconductor device 1 includes the semiconductor chip 2, the ceramic circuit substrate 3 on which the semiconductor chip 2 is mounted, and the radiator plate 4 with the ceramic circuit substrate 3 fitted thereto. On the rear surface of the ceramic circuit substrate 3, dimples 3c2 which are depressions are formed. The semiconductor chip 2 and the ceramic circuit substrate 3 are joined together via a bonding member such as solder 5a. In addition, the ceramic circuit substrate 3 and the radiator plate 4 are joined together via a bonding member such as solder 5b. Note that the semiconductor chip 2 may be provided in plurality on the ceramic circuit substrate 3 according to desired functions. Similarly, the ceramic circuit substrate 3 with the multiple semiconductor chips 2 installed according to the desired functions may also be provided in plurality on the radiator plate 4. Note however that the following describes an example where one set of the semiconductor chip 2 and the ceramic circuit substrate 3 is provided on the single radiator plate 4. In addition, although no illustration is given here, the semiconductor device 1 may be housed in a case provided with an external connecting terminal, and then a sealing resin may be used to seal off the inside of the case. In this case, the external connecting terminal (not illustrated) is electrically connected to the semiconductor chip 2 and the ceramic circuit substrate 3 using a wire or lead frame appropriately.

The semiconductor chip 2 may be a power semiconductor chip. The semiconductor chip 2 includes, for example, a switching element, such as an IGBT or power MOSFET. This semiconductor chip 2 includes, for example, an input electrode (a drain electrode or collector electrode) on the rear surface as a main electrode, and a control electrode (a gate electrode) and, as a main electrode, an output electrode (a source electrode or emitter electrode) on the front surface. The rear surface of the aforementioned semiconductor chip 2 is joined to the conductive pattern 3b by the solder 5a. The semiconductor chip 2 may include a diode, such as a Schottky barrier diode (SBD) or free wheeling diode (FWD). In this case, the semiconductor chip 2 includes an output electrode (cathode electrode) on its rear surface as a main electrode and an input electrode (anode electrode) on its front surface as a main electrode. The semiconductor chip 2 may be a reverse-conducting IGBT (RC-IGBT), which integrates an IGBT and FWD into one chip. The semiconductor chip 2 has a third edge face 2a1 on its side. The third edge face 2a1 faces the dimples 3c2 outwardly in a horizontal direction along a major surface of the ceramic circuit substrate 3. Further, the third edge face 2a1 is an edge face of the semiconductor chip 2, located closest to the dimples 3c2. In the case where a plurality of semiconductor chips 2 is provided on the ceramic circuit substrate 3, the third edge face 2a1 is an edge face located closest to the dimple 3c2 among the edge faces of the multiple semiconductor chips 2.

The ceramic circuit substrate 3 includes an insulating plate 3a, the conductive pattern 3b formed on the front surface of the insulating plate 3a, and a metal plate 3c formed on the rear surface of the insulating plate 3a. As for the conductive pattern 3b, the shape and number thereof are just an example. The insulating plate 3a is made of ceramics with high thermal conductivity, such as aluminum oxide, aluminum nitride, or silicon nitride, which conduct heat well. The insulating plate 3a has a thickness of T1. The conductive pattern 3b is made of metal with excellent electrical conductivity, such as copper or a copper alloy. The conductive pattern 3b has a first edge face 3b1 on its side. The first edge face 3b1 has a thickness of T2. The first edge face 3b1 faces outwardly in a horizontal direction along the major surface of the ceramic circuit substrate 3 and is located outwardly from the dimples 3c2. The metal plate 3c is made of metal having excellent thermal conductivity, such as aluminum, iron, silver, copper, or an alloy composed of at least one of these. The metal plate 3c has a second edge face 3c1 on its side. The second edge face 3c1 has a thickness of T3. The second edge face 3c1 faces outwardly in a horizontal direction along the major surface of the ceramic circuit substrate 3 and is located outwardly from the first edge face 3b1. As the ceramic circuit substrate 3 configured as described above, a direct copper bonding (DCB) substrate or active metal brazed (AMB) substrate may be used, for example. Note that the thicknesses T1, T2, and T3 of the insulating plate 3a, the conductive pattern 3b, and the metal plate 3c are preferably in the range of 0.05 mm to 2.00 mm inclusive, and more preferably in the range of 0.10 mm to 0.65 mm inclusive.

On the rear surface of the metal plate 3c in the ceramic circuit substrate 3, the dimples 3c2 which are depressions are formed. The dimples 3c2 are aligned in an array along the outer periphery of the rear surface of the metal plate 3c, as illustrated in FIG. 2. The formation locations and number of the dimples 3c2 and the number of arrays illustrated in FIGS. 1 and 2 are just an example. For example, the dimples 3c2 may be formed along a part of the outer periphery. The dimples 3c2 may be aligned in a plurality of lines, for example, two or three lines. As illustrated in FIGS. 1 and 2, each of the dimples 3c2 may have a circular arc shape in a cross-sectional view and a circular shape in planar view. The individual dimples 3c2 may preferably have a spherical cap shape or spherical frustum shape. This allows the dimples 3c2 to be easily filled with the solder 5b and thus the dimples 3c2 are less likely to contain voids. In addition, the dimples 3c2 do not pass through the metal plate 3c so the inner surface of each dimple 3c2 is formed of the metal plate 3c. This increases the wettability of the solder 5b in the dimples 3c2, further facilitating the dimples 3c2 to be filled with the solder 5b. These dimples 3c2 are formed by chemically or physically etching predetermined locations on the rear surface of the metal plate 3c. Note here that the etching is applied such that the dimples 3c2 of the first embodiment do not penetrate the metal plate 3c. In addition, the dimples 3c2 are formed, avoiding corner regions 3c3 of the conductive pattern 3b and the metal plate 3c. As illustrated in FIG. 2, each corner region 3c3 is an area around corners, indicated by the dashed circle. It is preferable, for example, that the dimples 3c2 be formed, avoiding each intersection 3c4 where a line of the multiple dimples 3c2 meets another line.

The ceramic circuit substrate 3 is joined to the radiator plate 4 via the solder 5b. Herewith, the ceramic circuit substrate 3 conducts heat generated in the semiconductor chip 2 through the conductive pattern 3b, the insulating plate 3a, and the metal plate 3c to the radiator plate 4 depicted in the lower part of FIG. 1, to thereby dissipate the heat. The dimples 3c2 are preferably filled with the solder 5b, and more preferably completely filled with the solder 5b without voids. The dimples 3c2 being filled with the solder 5b mitigate deformation of the ceramic circuit substrate 3 induced by thermal stress. As a result, cracks are less likely to occur in the insulating plate 3a. In addition, the heat dissipation is improved. Note that the solder 5b is one example of a bonding member, and sintered metal or an adhesive material may be used instead.

In the above-described ceramic circuit substrate 3, the first edge face 3b1 of the conductive pattern 3b is located inwardly of the ceramic circuit substrate 3 in a horizontal direction along the main surface of the ceramic circuit substrate 3 at a first distance (d1) away from the second edge face 3c1 of the metal plate 3c. In other words, the first distance (d1) is an edge-to-edge distance between the first edge face 3b1 of the conductive pattern 3b and the second edge face 3c1 of the metal plate 3c. In this case, the first distance (d1) is more than 0 mm but 0.60 mm or less, and more preferably more than 0 mm but 0.30 mm or less. The third edge face 2a1 of the semiconductor chip 2 is located inwardly of the ceramic circuit substrate 3 in a horizontal direction along the main surface of the ceramic circuit substrate 3 at a second distance (d2) away from the second edge face 3c1 of the metal plate 3c. In addition, the third edge face 2a1 of the semiconductor chip 2 is located inwardly of the ceramic circuit substrate 3 in a horizontal direction along the main surface of the ceramic circuit substrate 3 at a fourth distance (d4) away from the first edge face 3b1 of the conductive pattern 3b.

Next described is the location where each dimple 3c2 is formed. Note that the location where each dimple 3c2 is formed refers to a site which encompasses the entire dimple 3c2. For example, in the case of the dimple 3c2 depicted in FIG. 1, the location where the dimple 3c2 is formed spans from the left edge of the dimple 3c2 where the depression starts on the surface of the metal plate 3c to the right edge where the depression ends. Each dimple 3c2 is located inwardly of the ceramic circuit substrate 3 in a horizontal direction along the main surface of the ceramic circuit substrate 3, at a distance from the first edge face 3b1 of the conductive pattern 3b. In addition, the dimple 3c2 is located outwardly in the ceramic circuit substrate 3 from the third edge face 2a1 of the semiconductor chip 2 in a horizontal direction along the main surface of the ceramic circuit substrate 3. That is, the dimple 3c2 is situated between the first edge face 3b1 of the conductive pattern 3b and the third edge face 2a1 of the semiconductor chip 2. In addition to the aforementioned positional relationships being secured, the dimple 3c2 is formed in a range of depression formation distance defined by expression (1) below. T1 is the thickness of the insulating plate 3a, the first distance (d1) is the edge-to-edge distance between the first edge face 3b1 of the conductive pattern 3b and the second edge face 3c1 of the metal plate 3c, and the second distance (d2) is the edge-to-edge distance between the third edge face 2a1 of the semiconductor chip 2 and the second edge face 3c1 of the metal plate 3c. Note that expressions for these variables are described later.

The depression formation distance from the first edge face 3b1 of the conductive pattern 3b falls in at least one of the following ranges:

0<depression formation distance≤$(0.9 \times T1^2/\text{first distance } (d1))$, and $(1.1 \times T1^2/\text{first distance } (d1)) \leq$ depression formation distance<second distance (d2)  (1).

The radiator plate 4 is made of a material with excellent thermal conductivity, such as aluminum, iron, silver, copper, or an alloy composed of at least one of these. In order to provide improved corrosion resistance, for example, nickel plating or the like may be applied to coat the surface of the radiator plate 4. Specifically, other than nickel, a nickel-phosphorus alloy or nickel-boron alloy may be used. Note that, to improve heat dissipation, a cooler (not illustrated) may be provided on the rear surface of the radiator plate 4. As the cooler, a fin, a heatsink with a plurality of fins, or a water cooling system may be used, for example. In addition, the radiator plate 4 may be integrally formed with such a cooler. In that case, the radiator plate 4 is made of a material with excellent thermal conductivity, such as aluminum, iron, silver, copper, or an alloy composed of at least one of these. Then, in order to provide improved corrosion resistance, for example, nickel plating or the like may be applied to coat the surface of the radiator plate 4 integrally formed with the cooler. Specifically, other than nickel, a nickel-phosphorus alloy or nickel-boron alloy may be used.

Figure 3A:
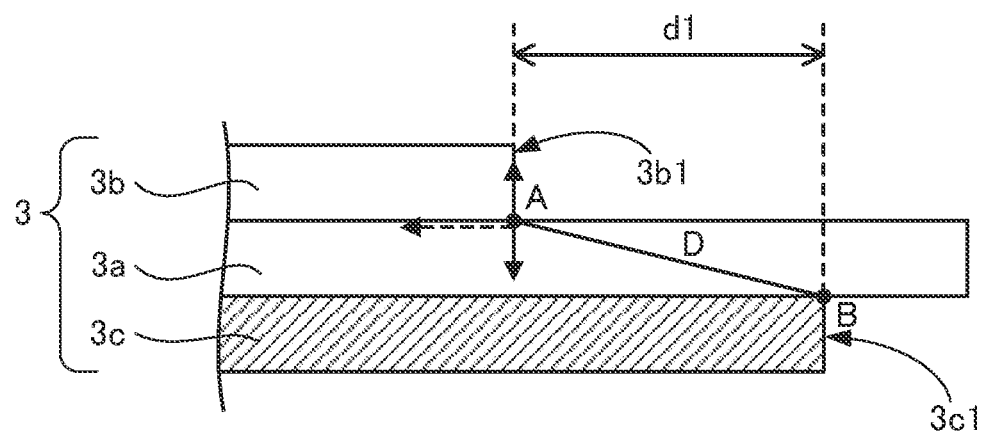
FIGS. 3A and 3B are a first part of drawings illustrating a crack induced in the ceramic circuit substrate included in the semiconductor device of the first embodiment.
Figure 3B:
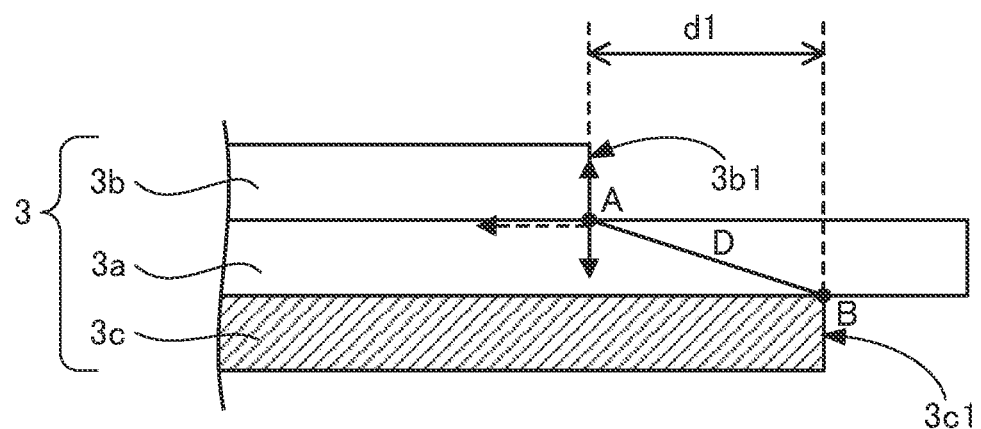
Figure 4A:
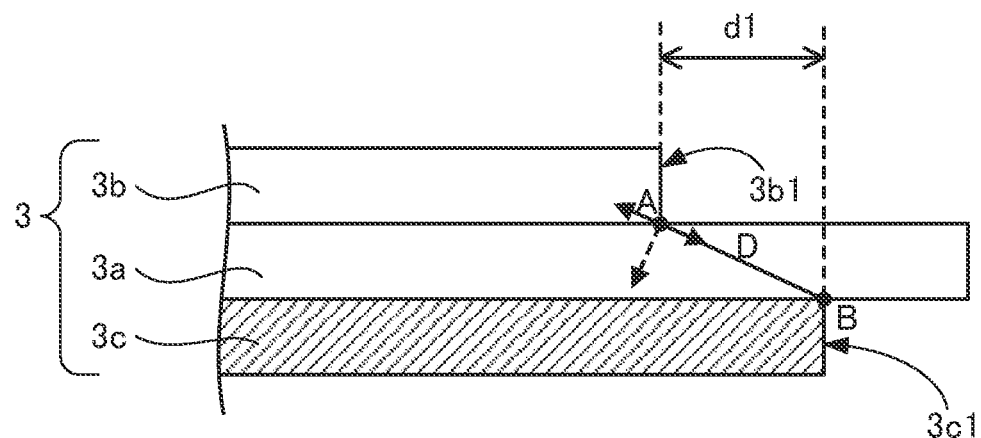
FIGS. 4A and 4B are a second part of the drawings illustrating a crack induced in the ceramic circuit substrate included in the semiconductor device of the first embodiment.
Figure 4B:
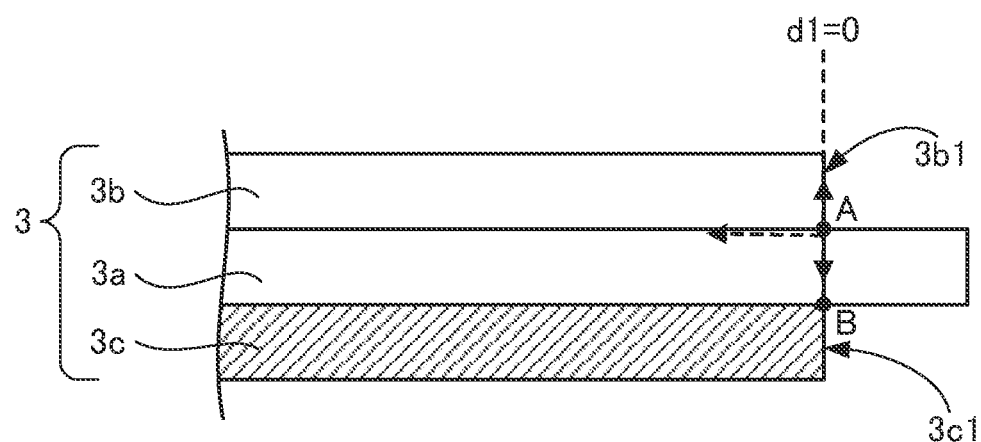

The aforementioned expression (1) is explained next. In this connection, the direction of a crack induced in the insulating plate 3a according to the first distance (d1), which is the edge-to-edge distance between the first edge face 3b1 of the conductive pattern 3b and the second edge face 3c1 of the metal plate 3c in the ceramic circuit substrate 3, is first described with reference to FIGS. 3 to 5. FIGS. 3 and 4 illustrate a crack induced in the ceramic circuit substrate included in the semiconductor device of the first embodiment. Note that FIGS. 3 and 4 are simplified schematics of the semiconductor device 1, representing only the ceramic circuit substrate 3. FIGS. 3A and 3B and FIGS. 4A and 4B depict cases where the first distance (d1) is progressively reduced in this order. Each of the diagrams represents stress (solid arrow) applied to Point A and the direction of crack propagation (dashed arrow) under the situation. Note that Point A is a corner of the conductive pattern 3b abutting on the front surface of the insulating plate 3a. Here, the insulating plate 3a, the conductive pattern 3b, and the metal plate 3c have thicknesses of T1, T2, and T3, respectively, as stated previously. In this case, a distance (D) that is a distance between Point A and Point B, which is a corner of the metal plate 3c abutting on the rear surface of the insulating plate 3a, is defined by the following expression (2):

distance between Points $A$ and $B(D)=(T1^2+d1^2)^{1/2}$  (2).

Figure 5:
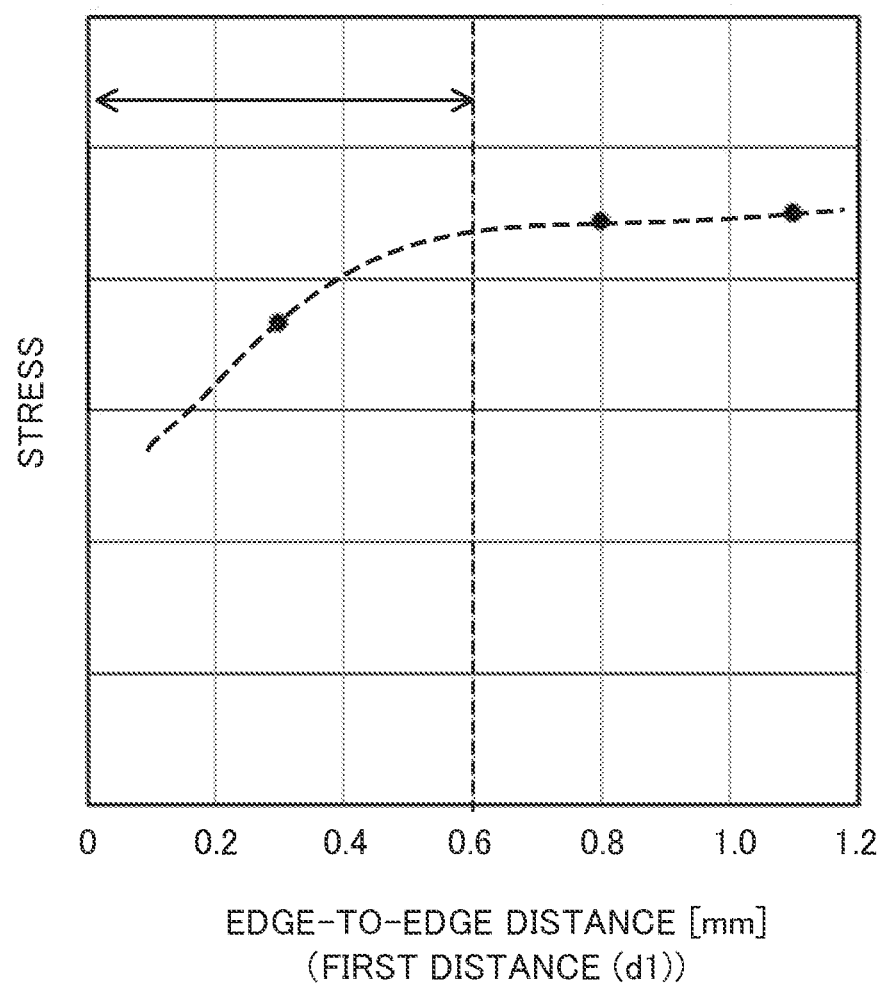
FIG. 5 is a graph that plots a relationship between stress and edge-to-edge distance.

FIG. 5 is a graph that plots the relationship between the stress and the edge-to-edge distance. In FIG. 5, the X axis represents the edge-to-edge distance (first distance (d1)) in millimeters (mm) while the Y axis represents the stress.

First, in the case of the first distance (d1) being about 1.10 mm (see the graph of FIG. 5), as illustrated in FIG. 3A, stress occurs at Point A, where the corner of the conductive pattern 3b abuts on the insulating plate 3a, in a vertical direction to the front surface of the insulating plate 3a. If stress is exerted on Point A in such an orientation, a crack is likely to develop in a horizontal direction along the front surface of the insulating plate 3a, propagating inwardly from Point A. That is, the direction of crack propagation is 0 degrees to the front surface of the insulating plate 3a.

Next, even when the first distance (d1) is made shorter than the state depicted in FIG. 3A, as illustrated in FIG. 3B, large stress occurs at Point A, where the corner of the conductive pattern 3b abuts on the insulating plate 3a, in a vertical direction to the front surface of the insulating plate 3a, as in the case of FIG. 3A. A crack induced by the stress develops in a horizontal direction along the front surface of the insulating plate 3a, propagating inwardly from Point A. According to the graph of FIG. 5, the stress in a vertical direction to the front surface of the insulating plate 3a remains nearly constant when the first distance (d1) is in the range of about 1.10 mm to about 0.60 mm.

When the first distance (d1) is progressively made even shorter than the state depicted in of FIG. 3B and then the distance (D) between Points A and B becomes equal to the sum (T2+T3) of the thicknesses T2 and T3 of the conductive pattern 3b and the metal plate 3c (i.e., D=T2+T3), Point A starts being pulled toward Point B. Herewith, the orientation of the stress at Point A is inclined in the direction of being pulled toward Point B, as depicted in FIG. 4A. With this, the stress starts decreasing compared to the states depicted in FIGS. 3A and 3B. According to the graph of FIG. 5, the stress decreases when the first distance (d1) is 0.60 mm or less. Along with the change in the orientation of the stress, the direction of crack propagation also becomes inclined to a horizontal direction along the front surface of the insulating plate 3a, pointing toward the metal plate 3c from Point A. Due to the reduced stress and the direction of crack propagation being set toward the metal plate 3c, a crack is less likely to develop in the insulating plate 3a.

When the first distance (d1) is progressively made even shorter than the state depicted in FIG. 4A and then the distance (D) between Points A and B becomes closer to 0 mm, the stress decreases further than the case of FIG. 4A. Because the stress orientation coincides with the direction in which Point A is pulled toward Point B, it rotates and becomes increasingly closer to a direction perpendicular to the front surface of the insulating plate 3a. That is, when the first distance (d1) becomes close to 0 mm, the stress orientation shifts back toward the original. With this, the direction of crack propagation is also brought increasingly closer to a horizontal direction along the front surface of the insulating plate 3a, barely pointing toward the metal plate 3c from Point A. Thus, although the stress decreases, the direction of crack propagation starts pointing toward the insulating plate 3a, which is likely to cause a crack in the insulating plate 3a.

Finally, when the first distance (d1) is made further shorter to be 0 mm such that the distance (D) between Points A and B becomes T1, which is shorter than the sum (T2+T3) of the thicknesses T2 and T3 (i.e., D=T1<T2+T3), the stress orientation and the direction of crack propagation shift back to the state depicted in FIG. 3A, as illustrated in FIG. 4B. That is, a crack is likely to develop in a horizontal direction along the front surface of the insulating plate 3a, propagating inwardly from Point A.

Therefore, according to the graph of FIG. 5, when the first distance (d1) exceeds a predetermined threshold (about 0.60 mm in reference to FIG. 5), the magnitude of the stress is significant and a crack is thus likely to develop in a horizontal direction along the front surface of the insulating plate 3a, propagating inwardly. On the other hand, when the first distance (d1) is below the predetermined threshold (about 0.60 mm in reference to FIG. 5), the direction of crack propagation is inclined to a horizontal direction along the front surface of the insulating plate 3a. As a result, a crack is less likely to develop in the insulating plate 3a. As for a threshold (upper threshold) of the first distance (d1) in this case, the following expression (3) is obtained because expression (2) is equal to the sum (T2+T3) of the thicknesses T2 and T3 $((T1^2+d1^2)^{1/2}=T2+T3)$:

$$\text{first distance }(d1)=(T2^2+T3^2-T1^2+2\times T2\times T3)^{1/2} \qquad (3).$$

When the first distance (d1) is 0 mm, a crack is likely to develop in a horizontal direction along the front surface of the insulating plate 3a, propagating inwardly from Point A. Note that if the first distance (d1) is less than 0 mm, i.e., if the conductive pattern 3b is longer than the metal plate 3c, a crack may develop in the conductive pattern 3b, beginning at Point B. In addition, grooves on the conductive pattern 3b, corresponding to a circuit pattern, make a crack even more likely to propagate. In view of these considerations, the first distance (d1) preferably falls in the range defined by the following expression (4). In the case of the graph of FIG. 5, the first distance (d1) is preferably greater than 0 mm and less than or equal to 0.60 mm.

$$0<\text{first distance }(d1)\leq(T2^2+T3^2-T1^2+2\times T2\times T3)^{1/2} \qquad (4).$$

Next described is where on the rear surface of the metal plate 3c in the above-described ceramic circuit substrate 3 the dimples are formed, with reference to FIGS. 6A to 6D. FIGS. 6A to 6D are diagrams illustrating dimples formed on the metal plate of the ceramic circuit substrate included in the semiconductor device of the first embodiment. Note that each of FIGS. 6A to 6D offers an example of the dimples 3c2 properly formed in the metal plate 3c when the first distance (d1) associated with the ceramic circuit substrate 3 with the semiconductor chip 2 mounted thereon is changed in length. FIGS. 6A to 6D omit the solders 5a and 5b and the radiator plate 4. In addition, in FIGS. 6A to 6D, the dashed arrow from Points A to C represents the direction of crack propagation. An edge-to-edge distance (e) between Point A on the first edge face 3b1 of the conductive pattern 3b and Point C, which is a crack propagation front on the metal plate 3c, is defined by the following expression (5). In expression (5), T1 is the thickness of the insulating plate 3a, and the first distance (d1) is the edge-to-edge distance between the first edge face 3b1 of the conductive pattern 3b and the second edge face 3c1 of the metal plate 3c.

$$e=T1^2/d1 \qquad (5).$$

If the dimple 3c2 is located at a crack propagation front, the crack may develop into the dimple 3c2. For this reason, the dimples 3c2 need to be formed on the rear surface of the metal plate 3c in the ceramic circuit substrate 3, avoiding the crack propagation front. A crack propagates not only linearly but sometimes in a slightly curved manner from the crack origin. Given the possibility of a crack propagating in a slightly curved manner from the crack origin, the displacement range of the crack propagation front is set to preferably ±10%, more preferably ±20%. Another consideration is that if the dimples 3c2 are formed in an area just below the semiconductor chip 2, the heat dissipation of the semiconductor chip 2 is significantly impaired, which is not preferable. Hence, the dimples 3c2 need to be positioned more outwardly than the third edge face 2a1 of the semiconductor chip 2. In view of the above considerations, the ranges where the dimples 3c2 are formed are defined, using the edge-to-edge distance (e) measured from Point A on the edge face 3b1 of the conductive pattern 3b, preferably by expression (6), and more preferably by expression (7) below.

$$0 < \text{edge-to-edge distance } (e) \le (0.9 \times T1^2/\text{first distance } (d1)), \text{ and}$$

$$(1.1 \times T1^2/\text{first distance } (d1)) \le \text{edge-to-edge distance } (e) < \text{second distance } (d2) \quad (6).$$

$$0 < \text{edge-to-edge distance } (e) \le (0.8 \times T1^2/\text{first distance } (d1)), \text{ and}$$

$$(1.2 \times T1^2/\text{first distance } (d1)) \le \text{edge-to-edge distance } (e) < \text{second distance } (d2) \quad (7).$$

Note here that the edge-to-edge distance (e) between Point A on the first edge face 3b1 of the conductive pattern 3b and Point C, which is a crack propagation front on the metal plate 3c, corresponds to the ranges of the depression formation distance which are the formation ranges of the dimples 3c2. Hence, expression (1) is obtained from expression (6). Similarly, expression (7) is rewritten as expression (8) below.

The depression formation distance from the first edge face 3b1 of the conductive pattern 3b falls in at least one of the following ranges:

$$0 < \text{depression formation distance} \le (0.8 \times T1^2/\text{first distance } (d1)), \text{ and}$$

$$(1.2 \times T1^2/\text{first distance } (d1)) \le \text{depression formation distance} < \text{second distance } (d2) \quad (8).$$

Figure 6A:
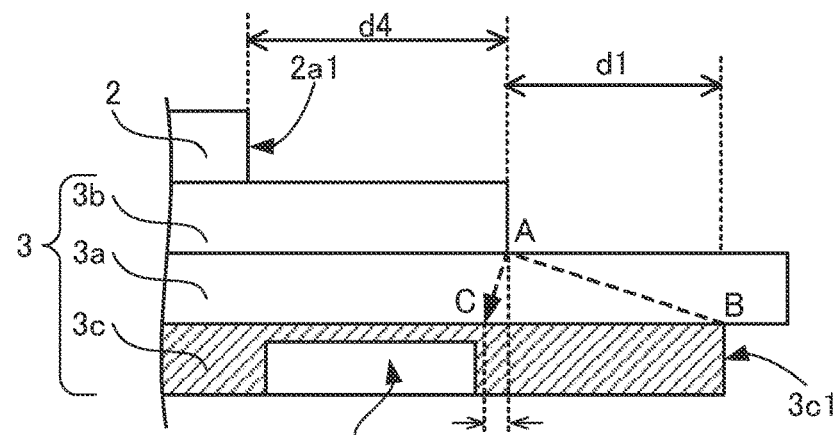
FIGS. 6A to 6D are diagrams illustrating dimples formed on a metal plate of the ceramic circuit substrate included in the semiconductor device of the first embodiment.
Figure 6B:
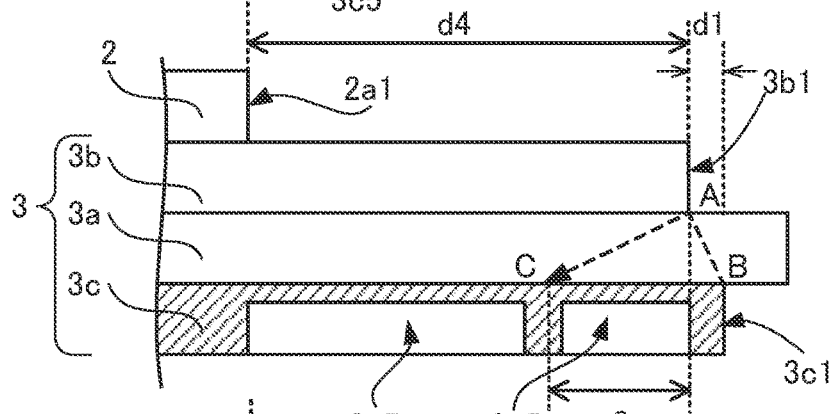
Figure 6C:
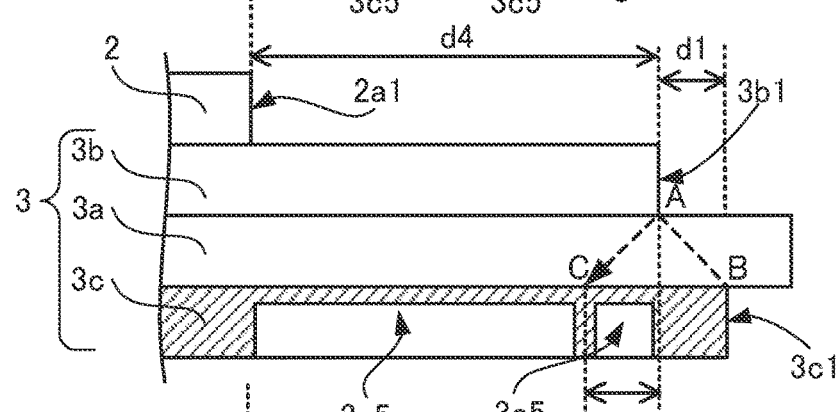
Figure 6D:
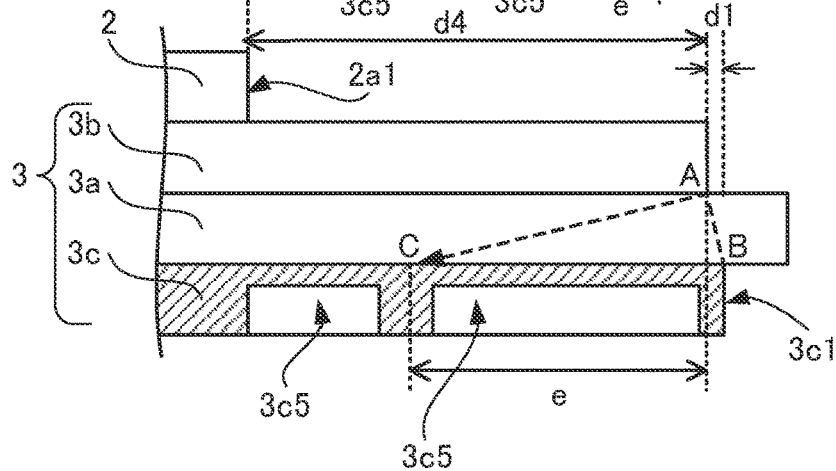

In the ceramic circuit substrate 3 of FIGS. 6A to 6D, one or more formation ranges 3c5 for the dimples 3c2, satisfying the above-mentioned conditions, are depicted. In FIG. 6A, one formation range 3c5 for the dimples 3c2 is located on the rear surface of the metal plate 3c in the ceramic circuit substrate 3, outwardly from the third edge face 2a1 of the semiconductor chip 2 and inwardly from the crack propagation front. One or more dimples 3c2 may be provided in this formation range 3c5. In FIGS. 6B to 6D, one formation range 3c5 for the dimples 3c2 is located on the rear surface of the metal plate 3c in the ceramic circuit substrate 3, outwardly from the third edge face 2a1 of the semiconductor chip 2 and inwardly from the crack propagation front. In addition, another formation range 3c5 for the dimples 3c2 is located on the rear surface of the metal plate 3c, outwardly from the crack propagation front and inwardly from the first edge face 3b1 of the conductive pattern 3b. In FIGS. 6B to 6D, one or more dimples 3c2 may also be provided in each of the formation ranges 3c5.

The above-described semiconductor device 1 includes the semiconductor chip 2 and the ceramic circuit substrate 3 including the conductive pattern 3b with a thickness of T2, on the front surface of which the semiconductor chip 2 is mounted, the insulating plate 3a with a thickness of T1, which is positioned on the rear surface of the conductive pattern 3b, and the metal plate 3c with a thickness of T3, which is positioned on the rear surface of the insulating plate 3a and has the dimples 3c2 formed on its rear surface. When the semiconductor device 1 is viewed from the side, the first edge face 3b1 of the conductive pattern 3b is located inwardly of the ceramic circuit substrate 3 in a horizontal direction along the main surface of the ceramic circuit substrate 3 at the first distance (d1) away from the second edge face 3c1 of the metal plate 3c. In addition, the third edge face 2a1 of the semiconductor chip 2 is located inwardly of the ceramic circuit substrate 3 in a horizontal direction along the main surface of the ceramic circuit substrate 3 at the second distance (d2) away from the second edge face 3c1. Further, the dimples 3c2 are located inwardly of the ceramic circuit substrate 3 in a horizontal direction along the main surface of the ceramic circuit substrate 3, at a distance from the first edge face 3b1. Specifically, the location where the dimples 3c2 are formed is defined as expression (1) above. Furthermore, the first distance (d1) preferably satisfies expression (4) above. The formation of the dimples 3c2 on the rear surface of the metal plate 3c in this manner reduces stress acting on the insulating plate 3a, thus preventing a crack from developing. Especially, because the dimples 3c2 are not formed near the corners of the metal plate 3c, it is possible to prevent development of cracks in the insulating plate 3a around the corners of the conductive pattern 3b. This prevents degradation in the quality of the semiconductor device 1 and thus leads to improved yield, thereby increasing the reliability.

2. Second Embodiment

Figure 7:
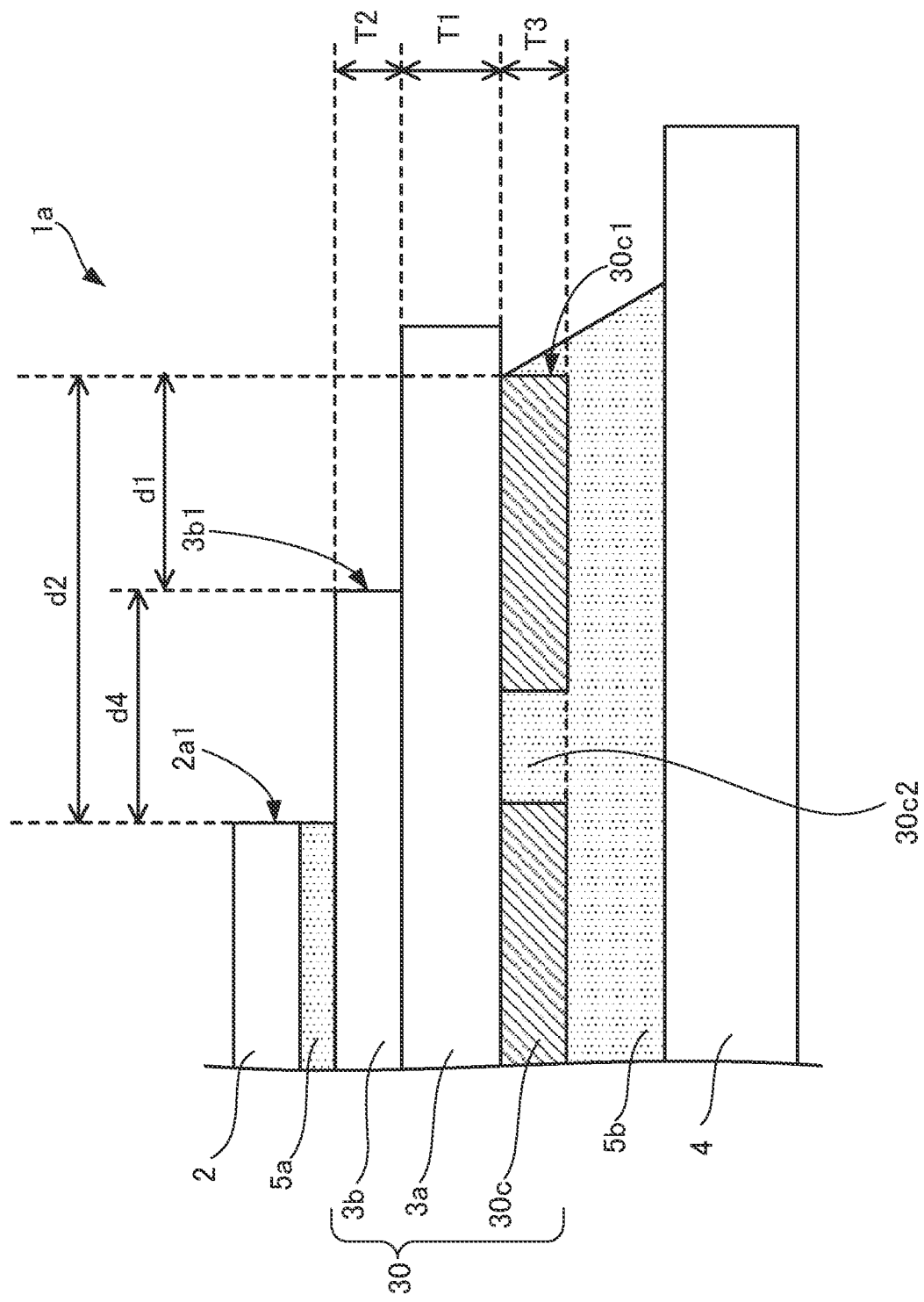
FIG. 7 is a cross-sectional view of a semiconductor device according to a second embodiment.

A second embodiment is directed to the case where dimples provided on the rear surface of the metal plate 3c in the ceramic circuit substrate 3 penetrate the metal plate 3c, which is described with reference to FIG. 7. FIG. 7 is a cross-sectional view of a semiconductor device according to the second embodiment. That is, a semiconductor device 1a in the cross-sectional view of FIG. 7 has dimples formed by puncturing the dimples 3c2 of the semiconductor device 1 of the first embodiment to the insulating plate 3a. As for the semiconductor device 1a of FIG. 7, like components to those of the semiconductor device 1 of the first embodiment are denoted by like reference numerals, and the detailed description thereof will be omitted.

The semiconductor device 1a includes the semiconductor chip 2, a ceramic circuit substrate 30 on which the semiconductor chip 2 is mounted, and the radiator plate 4 with the ceramic circuit substrate 30 fitted thereto. Although no illustration is given here, the semiconductor device 1a is also housed in a case provided with an external connecting terminal. A sealing resin may be used to seal off the inside of the case. In this case, the external connecting terminal (not illustrated) is electrically connected to the semiconductor chip 2 and the ceramic circuit substrate 30 using a wire appropriately.

The ceramic circuit substrate 30 includes the insulating plate 3a, the conductive pattern 3b formed on the front surface of the insulating plate 3a, and a metal plate 30c formed on the rear surface of the insulating plate 3a. The metal plate 30c is made of metal having excellent thermal conductivity, such as aluminum, iron, silver, copper, or an alloy composed of at least one of these. The metal plate 30c has a second edge face 30c1 on its side. Further, dimples 30c2 which are depressions are formed on the rear surface of the metal plate 30c. These multiple dimples 30c2 are aligned in an array along the outer periphery of the rear surface of the metal plate 30c, as in the case of the dimples 3c2 of the first embodiment illustrated in FIG. 2. The dimples 30c2 individually penetrate the metal plate 30c, as illustrated in FIG. 7. Each of the dimples 30c2 may preferably have a spherical frustum shape, a cylindrical configuration, or a shape formed by combining a spherical frustum and a cylindrical configuration. This allows the dimples 30c2 to be filled with the solder 5b and thus the dimples 30c2 are less likely to contain voids. The dimples 30c2 are formed by chemically or physically etching predetermined locations on the rear surface of the metal plate 30c. Note however that the dimples 30c2 penetrate the metal plate 30c. In addition, the dimples 30c2 are formed, avoiding the corner regions 3c3 which are areas around the corners of the metal plate 30c, as is the case with the dimples 3c2 of FIG. 2. It is preferable, for example, that the dimples 30c2 be formed, avoiding each intersection 3c4 where a line of the multiple dimples 30c2 meets another line. The dimples 30c2 are also formed such that the edge-to-edge distance (e) between Point A on the first edge face 3b1 of the conductive pattern 3b and Point C, which is the crack propagation front on the metal plate 30c, satisfies expression (1) above. In addition, the first distance (d1) also satisfies expression (4) above.

According to the semiconductor device 1a, the formation of the dimples 30c2 on the rear surface of the metal plate 30c also reduces stress acting on the insulating plate 3a, thus preventing cracks from developing, as in the case of the semiconductor device 1 of the first embodiment. This prevents degradation in the quality of the semiconductor device 1a and thus leads to improved yield, thereby increasing the reliability.

According to one aspect, it is possible to relieve stress applied to the substrate while securing the layout area for the semiconductor chips, thus enhancing the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
    a semiconductor chip; and
    a substrate, including:
        an insulating plate with a thickness of T1,
        a conductive pattern with a thickness of T2, the semiconductor chip being mounted on a front surface of the conductive pattern, the insulating plate being positioned on a rear surface of the conductive pattern, and
        a metal plate with a thickness of T3, the metal plate being positioned on a rear surface of the insulating plate, and having a plurality of depressions formed on a rear surface thereof,
    wherein, in a side view of the semiconductor device,
        a first edge face, which is an edge face of the conductive pattern, is, measured inwardly of the substrate in a horizontal direction along a main surface of the substrate, at a first distance away from a second edge face that is an edge face of the metal plate,
        a third edge face, which is an edge face of the semiconductor chip, is, measured inwardly of the substrate in the horizontal direction, at a second distance away from the second edge face, and
        each of the plurality of depressions is located within a depression formation distance, measured inwardly of the substrate in the horizontal direction, from the first edge face, the depression formation distance satisfying at least one of:

$0 < \text{the depression formation distance} \leq (0.9 \times T1^2/\text{the first distance})$, and $(1.1 \times T1^2/\text{the first distance}) \leq \text{the depression formation distance} < \text{the second distance}$, each depression being entirely located between the first edge face and the third edge face in the side view.

2. The semiconductor device according to claim 1, wherein:
    the depression formation distance further satisfies at least one of:

$0 < \text{the depression formation distance} \leq (0.8 \times T1^2/\text{the first distance})$, and $(1.2 \times T1^2/\text{the first distance}) \leq \text{the depression formation distance} < \text{the second distance}$.

3. The semiconductor device according to claim 1, wherein:
    the first distance satisfies:

$0 < \text{the first distance} \leq (T2^2 + T3^2 - T1^2 + 2 \times T2 \times T3)^{1/2}$.

4. The semiconductor device according to claim 1, wherein:
    each of the plurality of depressions is formed on the metal plate, avoiding, in a planar view of the semiconductor device, a vicinity of each corner of the conductive pattern and of the metal plate.

5. The semiconductor device according to claim 4, wherein:
    the plurality of depressions are formed in a ring shape along the sides of the metal plate on the rear surface of the metal plate, avoiding the vicinity of each corner at an intersection where a line of the depressions along one side of the metal plate meets another line of the depressions along another side of the metal plate.

6. The semiconductor device according to claim 1, wherein:
    each of the plurality of depressions has a spherical cap shape or a spherical frustum shape, and is formed on the metal plate without penetrating the metal plate.

7. The semiconductor device according to claim 1, wherein:
    each of the plurality of depressions has a spherical frustum shape or a cylindrical shape, and is formed on the metal plate to penetrate the metal plate.

8. The semiconductor device according to claim 1, wherein:
    no further conductive pattern is formed outside the conductive pattern on which the semiconductor chip is disposed.

* * * * *